United States Patent
Yamazaki et al.

(10) Patent No.: US 9,153,650 B2
(45) Date of Patent: Oct. 6, 2015

(54) OXIDE SEMICONDUCTOR

(71) Applicant: Semiconductor Energy Laboratory Co., Ltd., Atsugi-shi, Kanagawa-ken (JP)

(72) Inventors: Shunpei Yamazaki, Setagaya (JP); Masahiro Takahashi, Atsugi-shi (JP); Noboru Kimizuka, Warsaw (PL)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/208,661

(22) Filed: Mar. 13, 2014

(65) Prior Publication Data

US 2014/0284596 A1    Sep. 25, 2014

(30) Foreign Application Priority Data

Mar. 19, 2013 (JP) ................. 2013-056952

(51) Int. Cl.
*H01L 29/10*    (2006.01)
*H01L 29/22*    (2006.01)
*H01L 29/04*    (2006.01)

(52) U.S. Cl.
CPC ................ *H01L 29/22* (2013.01); *H01L 29/04* (2013.01)

(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

(Continued)

*Primary Examiner* — Jack Chen
(74) *Attorney, Agent, or Firm* — Eric J. Robinson; Robinson Intellectual Property Law Office, P.C.

(57) ABSTRACT

To provide an oxide semiconductor with a novel structure. Such an oxide semiconductor is composed of an aggregation of a plurality of $InGaZnO_4$ crystals each of which is larger than or equal to 1 nm and smaller than or equal to 3 nm, and in the oxide semiconductor, the plurality of $InGaZnO_4$ crystals have no orientation. Alternatively, such an oxide semiconductor is such that a diffraction pattern like a halo pattern is observed by electron diffraction measurement performed by using an electron beam with a probe diameter larger than or equal to 300 nm, and that a diffraction pattern having a plurality of spots arranged circularly is observed by electron diffraction measurement performed by using an electron beam with a probe diameter larger than or equal to 1 nm and smaller than or equal to 30 nm.

4 Claims, 9 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,935,964 B2 | 5/2011 | Kim et al. |
| 7,998,372 B2 | 8/2011 | Yano et al. |
| 8,168,544 B2 | 5/2012 | Chang |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,343,799 B2 | 1/2013 | Ito et al. |
| 2001/0046027 A1 | 11/2001 | Tai et al. |
| 2002/0000593 A1 | 1/2002 | Nishiyama et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0154561 A1 | 7/2007 | Takeda et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0008908 A1 | 1/2008 | Ishiwata et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0123130 A1 | 5/2010 | Akimoto et al. |
| 2010/0123136 A1 | 5/2010 | Lee et al. |
| 2010/0301329 A1 | 12/2010 | Asano et al. |
| 2011/0062433 A1 | 3/2011 | Yamazaki |
| 2011/0062436 A1 | 3/2011 | Yamazaki et al. |
| 2011/0084266 A1 | 4/2011 | Yamazaki et al. |
| 2011/0117698 A1 | 5/2011 | Suzawa et al. |
| 2012/0138922 A1 | 6/2012 | Yamazaki et al. |
| 2012/0211745 A1 | 8/2012 | Ueda et al. |
| 2013/0075723 A1 | 3/2013 | Yamazaki et al. |
| 2013/0214273 A1 | 8/2013 | Yamazaki et al. |
| 2014/0124776 A1 | 5/2014 | Takahashi et al. |
| 2014/0284596 A1* | 9/2014 | Yamazaki et al. ............ 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 | 6/2006 |
| JP | 2006-261483 | 9/2006 |
| JP | 2010-058135 | 3/2010 |

(56) References Cited

FOREIGN PATENT DOCUMENTS

| | | |
|---|---|---|
| JP | 2012-144431 | 8/2012 |
| WO | WO-2004/114391 | 12/2004 |
| WO | WO 2007/058231 | 5/2007 |

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kitzerow.H et al., "Observation of Blue Phases in Chiral Networks", Liquid Crystals, 1993, vol. 14, No. 3, pp. 911-916.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B(Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

FIG. 3
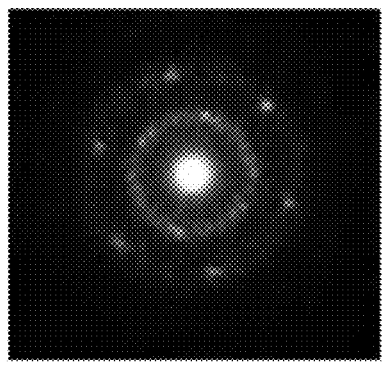
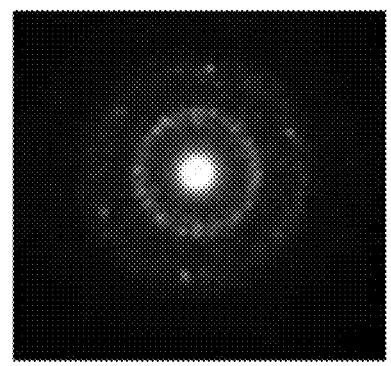
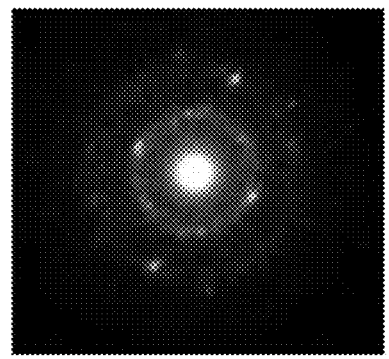
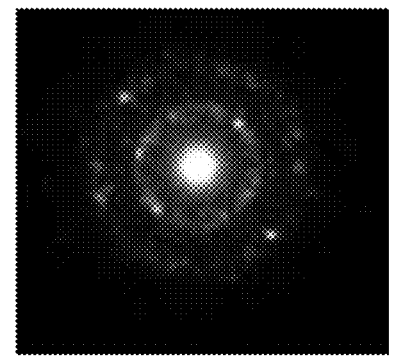

vertical axis: diffraction intensity [a. u.]
horizontal axis: magnitude of scattering vector |q| [nm$^{-1}$]

FIG. 6
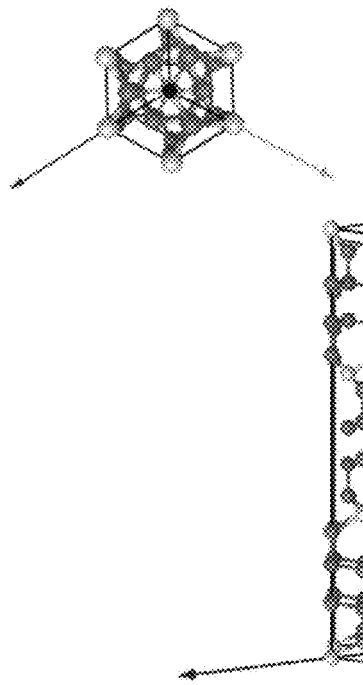
InGaZnO$_4$ crystal
density:6.4g/cm$^3$
number of total atoms:166
cell length
a : 0.3295nm
b : 0.3295nm
c : 2.607nm
$\alpha$: 90°  $\beta$: 90°  $\gamma$: 120°
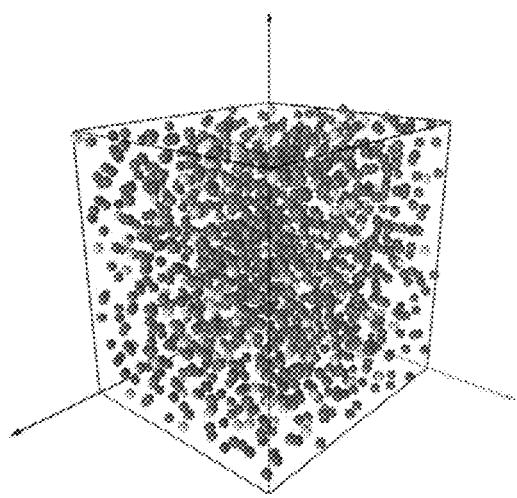
InGaZnO$_4$ amorphous
density:6.1g/cm$^3$
number of total atoms:1344
cell length
a : 2.67577nm
b : 2.31729nm
c : 2.64627nm
$\alpha$: 90°  $\beta$: 90°  $\gamma$: 90°

OXIDE SEMICONDUCTOR

BACKGROUND OF THE INVENTION

1. Field of the Invention

The present invention relates to an oxide semiconductor.

2. Description of the Related Art

The research on a structure of In—Ga—Zn oxide started with the synthesis of the In—Ga—Zn oxide by Kimizuka, Nakamura, et al. from National Institute for Research in Inorganic Materials. They reported that an In—Ga—Zn oxide had a homologous structure and was represented by a composition formula, $InGaO_3(ZnO)_m$ (m is a natural number) (see Patent Document 1 to Patent Document 6, and Non-Patent Document 1 to Non-Patent Document 4).

After that, a report about a transistor including amorphous In—Ga—Zn oxide was released (see Non-Patent Document 5). Since then, various research institutions and companies have actively researched and developed applied technology of In—Ga—Zn oxide.

[Patent Documents]

[Patent Document 1] Japanese Published Patent Application No. S63-210022

[Patent Document 2] Japanese Published Patent Application No. S63-210023

[Patent Document 3] Japanese Published Patent Application No. S63-210024

[Patent Document 4] Japanese Published Patent Application No. S63-215519

[Patent Document 5] Japanese Published Patent Application No. S63-239117

[Patent Document 6] Japanese Published Patent Application No. S63-265818

[Non-Patent Documents]

[Non-Patent Document 1] N. Kimizuka, and T. Mohri, *J. Solid State Chem.*, vol. 60, 1985, pp. 382-384

[Non-Patent Document 2] N. Kimizuka, et al., *J. Solid State Chem.*, vol. 116, 1995, pp. 170-178

[Non-Patent Document 3] M. Nakamura, *NIRIM NEWSLETTER*, vol. 150, 1995, pp. 1-4

[Non-Patent Document 4] M. Nakamura, et al., *J. Solid State Chem.*, vol. 93, 1991, pp. 298-315

[Non-Patent Document 5] K. Nomura, et al., *Nature*, vol. 432, 2004, pp. 488-492

SUMMARY OF THE INVENTION

An object is to provide an oxide semiconductor with a novel structure.

An oxide semiconductor according to one embodiment of the present invention is composed of aggregation of a plurality of crystals of $InGaZnO_4$ (also referred to as $InGaZnO_4$ crystals) each of which is larger than or equal to 1 nm and smaller than or equal to 3 nm. The plurality of $InGaZnO_4$ crystals have no orientation.

Further, an oxide semiconductor according to one embodiment of the present invention shows a diffraction pattern, like a halo pattern (diffraction pattern having no spot), that is observed when the oxide semiconductor is subjected to selected-area electron diffraction measurement with a probe diameter setting to larger than or equal to 300 nm. The oxide semiconductor shows a diffraction pattern having a plurality of spots circularly arranged when the oxide semiconductor is observed by electron diffraction measurement with a probe diameter setting to larger than or equal to 1 nm and smaller than or equal to 30 nm.

An oxide semiconductor having the following structure is referred to as a nanocrystalline oxide semiconductor (nc-OS). It is composed of aggregation of a plurality of crystals each of which is larger than or equal to 1 nm and smaller than or equal to 3 nm (the crystal is also referred to as nanocrystal (nc)), and the plurality of crystals have no orientation.

Although an nc-OS is sometimes difficult to distinguish from an amorphous oxide semiconductor, the nc-OS has characteristics described below and thus can be regarded as an oxide semiconductor having a novel structure.

Just for reference, an amorphous oxide semiconductor is described.

The amorphous oxide semiconductor is such an oxide semiconductor having disordered atomic arrangement and no crystal part. For example, the amorphous oxide semiconductor does not have a specific state as in quartz.

In an image obtained with a transmission electron microscope (TEM) (also referred to as a TEM image), a crystal part in the amorphous oxide semiconductor cannot be found.

When the amorphous oxide semiconductor is subjected to structural analysis by an out-of-plane method with an XRD apparatus, a peak which shows a crystal plane does not appear. A halo pattern is observed in an electron diffraction pattern of the amorphous oxide semiconductor.

The amorphous oxide semiconductor contains impurities such as hydrogen at a high concentration. In addition, the amorphous oxide semiconductor is an oxide semiconductor with a high density of defect states.

The oxide semiconductor having a high impurity concentration and a high density of defect states has many carrier traps or many carrier generation sources.

Next, an nc-OS is described.

The nc-OS has a periodic atomic order in a microscopic region. Note that there is no regularity of crystal orientation between different crystal parts in the nc-OS.

Accordingly, there is no orientation on the whole nc-OS. Thus, in some cases, the nc-OS cannot be distinguished from an amorphous oxide semiconductor depending on an analysis method. For example, in a TEM image of the nc-OS, a crystal cannot occasionally be observed clearly, which is similar to the case of an amorphous oxide semiconductor. Further, in a TEM image of the nc-OS, a boundary between crystals, i.e., grain boundary, cannot be clearly observed occasionally. Furthermore, when the nc-OS is subjected to structural analysis by an out-of-plane method with an XRD apparatus using an X-ray having a larger diameter than a diameter of a crystal part, a peak indicating a crystal plane does not appear, which is similar to the case of an amorphous oxide semiconductor.

When the nc-OS is subjected to electron diffraction measurement using an electron beam with a probe diameter (e.g., 50 nm or larger) larger than a diameter of a crystal part, a halo pattern is occasionally observed. Meanwhile, when electron diffraction measurement is performed on the nc-OS by using an electron beam with a probe diameter (e.g., larger than or equal to 1 nm and smaller than or equal to 30 nm) that is almost equivalent to or smaller than a diameter of a crystal part (the diffraction measurement is also referred to as nanobeam electron diffraction measurement), spots can be observed. Further, in a nanobeam electron diffraction pattern of the nc-OS, a region with high luminance in a circular (ring) shape is shown in some cases. Also in a nanobeam electron diffraction pattern of the nc-OS, a plurality of spots are observed in a ring-like region in some cases.

Thus, the nc-OS is an oxide semiconductor that has high regularity as compared to an amorphous oxide semiconductor. Therefore, the nc-OS is likely to have a lower density of defect states than an amorphous oxide semiconductor.

An object is to provide an oxide semiconductor with a novel structure that can be used for a transistor or the like.

BRIEF DESCRIPTION OF THE DRAWINGS

FIG. 3 shows nanobeam electron diffraction patterns of an In—Ga—Zn oxide including nanocrystal.

FIG. 6 shows structural models used for calculation.

DETAILED DESCRIPTION OF THE INVENTION

Embodiments of the present invention will be described below in detail with reference to drawings.

Figure 1A:
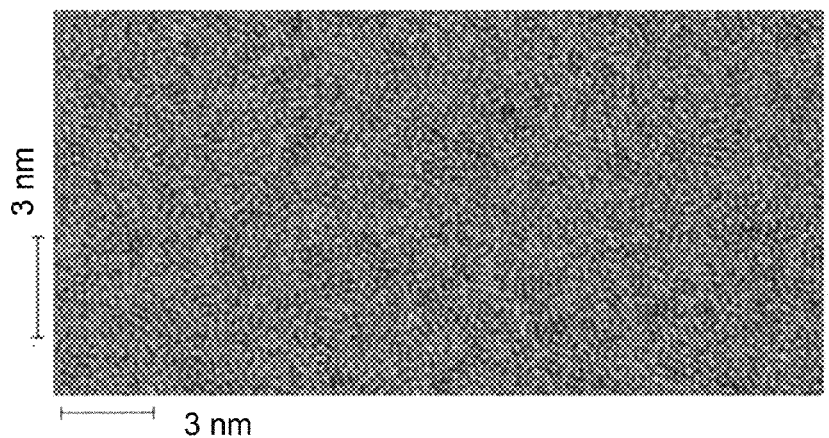
FIGS. 1A and 1B show a planar TEM image and electron diffraction patterns of an In—Ga—Zn oxide including nanocrystal.

FIG. 1A is a TEM image of an In—Ga—Zn oxide including nanocrystal, as an example of an nc-OS, observed from a planar surface side (the image is also referred to as planar TEM image).

The TEM image was observed with use of a Hitachi H-9000NAR transmission electron microscope by setting the accelerating voltage to 300 kV and the camera length to 500 mm. As a shooting medium, a film was used.

It is difficult to clearly observe crystallinity of the In—Ga—Zn oxide including nanocrystal (also referred to as nanocrystalline In—Ga—Zn oxide) in FIG. 1A.

Figure 1B:
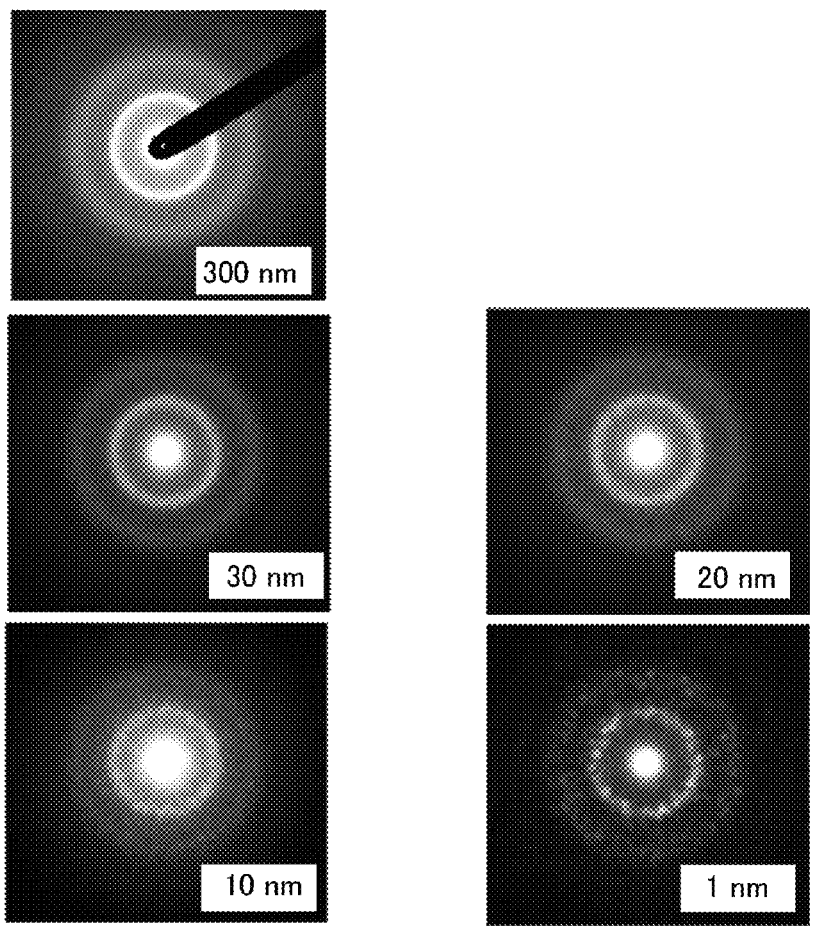

FIG. 1B shows electron diffraction patterns. One of them is an electron diffraction pattern which was observed when an electron beam with a probe diameter of 300 nm was incident on a cross section of Sample A that was the nanocrystalline In—Ga—Zn oxide thinned to approximately 50 nm (such electron diffraction is also referred to as selected area electron diffraction (SAED)). The other electron diffraction patterns were obtained by measuring nanobeam electron diffraction patterns of Sample A under conditions where probe diameters of electron beams were 30 nm, 20 nm, 10 nm, and 1 nm.

For measurement of selected area electron diffraction, a Hitachi H-9000NAR transmission electron microscope was used under conditions where the accelerating voltage was 300 kV and the camera length was 500 mm. Further, for measurement of nanobeam electron diffraction, a Hitachi HF-2000 field-emission transmission electron microscope was used under conditions where the accelerating voltage was 200 kV and the camera length was 400 mm. As a shooting medium, a film was used.

According to FIG. 1B, in the case of the selected area electron diffraction (probe diameter of 300 nm) of Sample A, a spot is not clearly observed, and an electron diffraction pattern like a blur halo pattern is observed. On the other hand, in the case of the nanobeam electron diffraction (probe diameters of 30 nm, 20 nm, 10 nm, and 1 nm) of Sample A, electron diffraction patterns having spots are observed. The number of spots is increased as the probe diameter is reduced.

Figure 2:
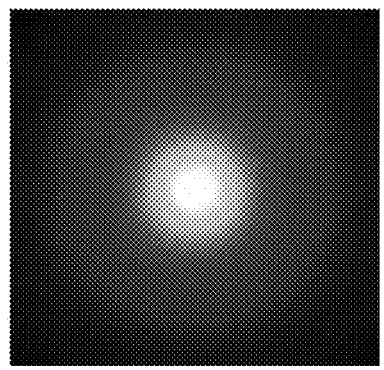
FIG. 2 shows a nanobeam electron diffraction pattern of a quartz substrate.

For comparison, nanobeam electron diffraction of quartz in an amorphous state was observed using a nanobeam with a probe diameter of 1 nm. As a result, an electron diffraction pattern that is a halo pattern shown in FIG. 2 was observed. Thus, the fact of the electron diffraction pattern having spots observed by the nanobeam electron diffraction measurement is one of proofs that Sample A is an aggregation of nanocrystals.

Furthermore, for more detailed structural analysis, nanobeam electron diffraction was measured in the following manner: an electron beam with a probe diameter of 1 nm was incident on a cross section of Sample B of a nanocrystalline In—Ga—Zn oxide thinned to several nanometers (approximately 5 nm or less). As a result, electron diffraction patterns having spots which indicate crystallinity and are shown in FIG. 3 were observed in four different portions. Note that as a shooting medium, films were used.

According to FIG. 3, diffraction patterns showing crystallinity were obtained from Sample B, but orientation along a crystal plane in a specific direction was not observed.

As described above, though an nc-OS is not distinguished from an amorphous oxide semiconductor in some cases depending on an analysis method, an exact analysis makes it possible to distinguish the nc-OS and the amorphous oxide semiconductor. Further, it is found that a microscopic region in the nc-OS has a periodic atomic order. Thus, the nc-OS is an oxide semiconductor that has high regularity as compared to an amorphous oxide semiconductor. Therefore, the nc-OS is likely to have a lower density of defect states than an amorphous oxide semiconductor.

Example 1

In this example, detailed structural analysis of an In—Ga—Zn oxide was conducted with calculation.

First, a nanobeam electron diffraction pattern of a nanocrystalline In—Ga—Zn oxide was obtained.

Figure 4A:
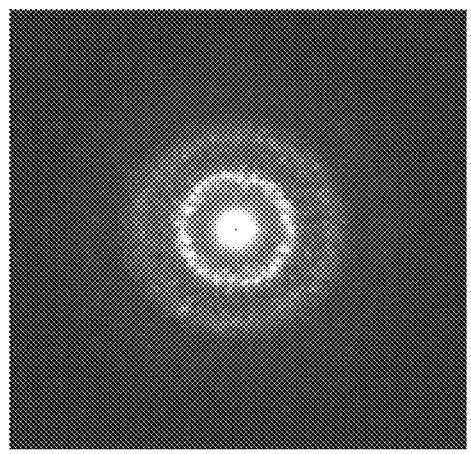
FIGS. 4A to 4C show structural analysis results of an In—Ga—Zn oxide including nanocrystal.

FIG. 4A shows an electron diffraction pattern that was obtained in the following manner: an electron beam with a probe diameter of 1 nm was incident on a cross section of Sample 1 of a nanocrystalline In—Ga—Zn oxide thinned to approximately 50 nm. Note that as a shooting medium, an imaging plate was used.

Figure 4B:
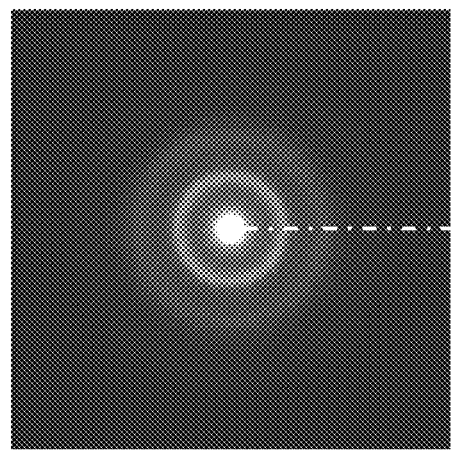
Figure 4C:
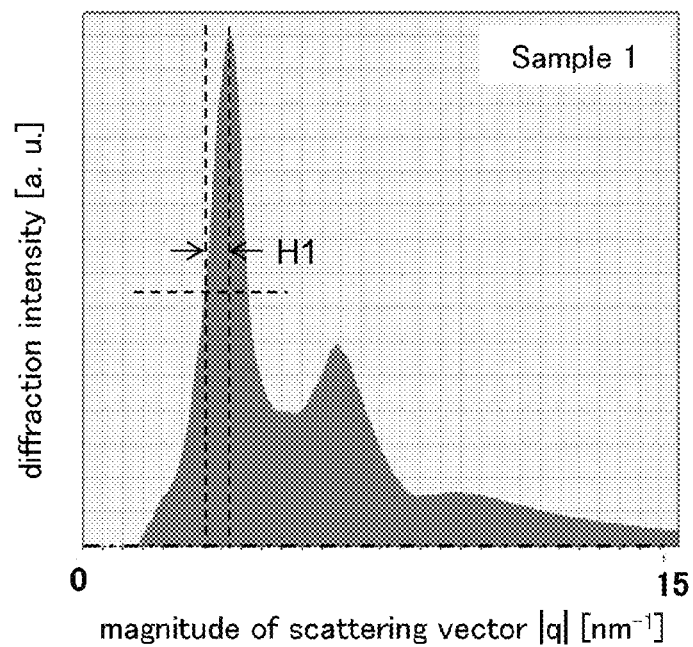

FIG. 4B shows an electron diffraction pattern that was averaged in the uniform magnitude of a scattering vector $|q|$ by rotating the electron diffraction pattern shown in FIG. 4A with a center of the pattern as an axis. FIG. 4C is a graph showing an electron diffraction luminance profile along a dashed-dotted line shown in FIG. 4B, where the horizontal axis indicates the magnitude of scattering vector $|q|$ $[nm^{-1}]$, and the vertical axis indicates the diffraction intensity [arbitrary unit]. Note that in FIG. 4C, a transmitted wave in the vicinity of the center in FIG. 4B is not taken into consideration for easy understanding.

Figure 5:
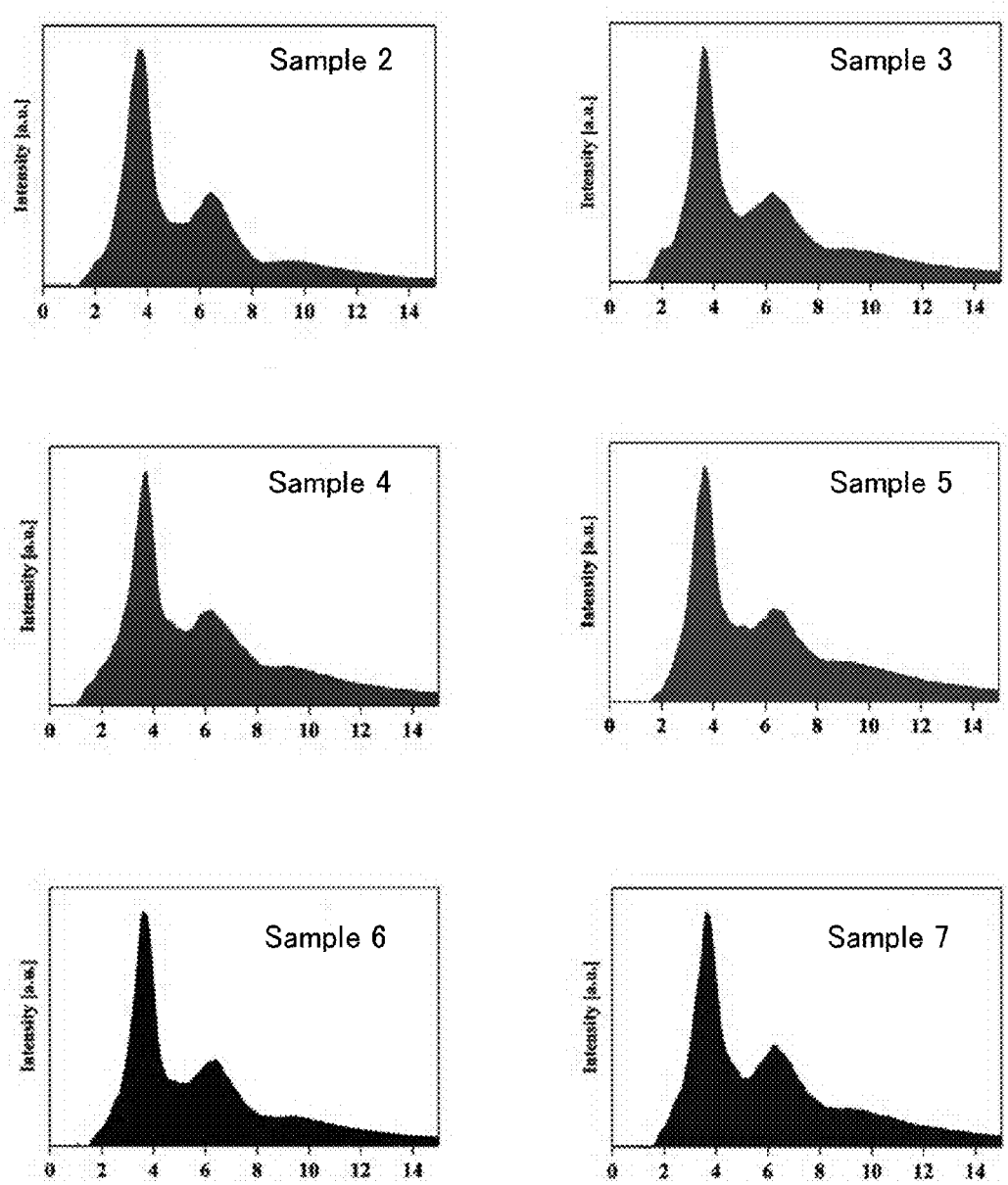
FIG. 5 shows structural analysis results of In—Ga—Zn oxides including nanocrystal.

In addition, a nanobeam with a probe diameter of 1 nm was incident on cross sections of Sample 2 to Sample 7 each of which was a nanocrystalline In—Ga—Zn oxide thinned to approximately 50 nm, whereby nanobeam electron diffraction patterns were obtained. Then, the obtained electron diffraction patterns were averaged in the uniform magnitude of a scattering vector $|q|$ by rotating the diffraction patterns with centers thereof as an axis. Profiles of electron diffraction luminance are shown in graphs where the horizontal axes indicate the magnitude of scattering vector $|q|$ $[nm^{-1}]$ and the vertical axes indicate the diffraction intensity [arbitrary unit] (see FIG. 5), like the case of Sample 1.

Next, as for InGaZnO$_4$ in a crystal state (crystalline InGaZnO$_4$) and InGaZnO$_4$ in an amorphous state (amorphous InGaZnO$_4$), calculation was performed. Then, graphs showing the calculation results of crystalline InGaZnO$_4$ and amorphous InGaZnO$_4$ were made (see FIG. 7 and FIG. 8). In the graphs, the horizontal axes indicate the magnitude of scattering vector |q| [nm$^{-1}$] and the vertical axes indicate the diffraction intensity [arbitrary unit].

For the calculation, TEM simulation software jems was used. The calculation mode was set to a mode for calculating powder patterns, and as the fitting function, Gaussian function was used. As the calculation conditions, the accelerating voltage was set to 200 kV, and the camera length was set to 400 mm.

For the calculation, InGaZnO$_4$ structure models shown in FIG. 6 were used. Note that the structure model of crystalline InGaZnO$_4$ was obtained from Inorganic Material Database of National Institute for Materials Science (AtomWork, http://crystdb.nims.go.jp). The structure model of amorphous InGaZnO$_4$ was made by a melt-quench method in classical molecular dynamics calculation. As software for the classical molecular dynamics calculation, "SCIGRESS ME 2.0" was used, and for potential, Born-Mayer-Huggins potential was used.

In the calculation, structure factors in each plane (hk1) of the structure models were determined, and the diffraction position and the diffraction intensity were calculated. A shape of a diffraction peak of each plane (hk1) was calculated by fitting using Gaussian function. Note that the sample shape was isotropic powder. The powder size generally relates to the half width at half maximum (HWHM) of the diffraction peak.

Figure 7:
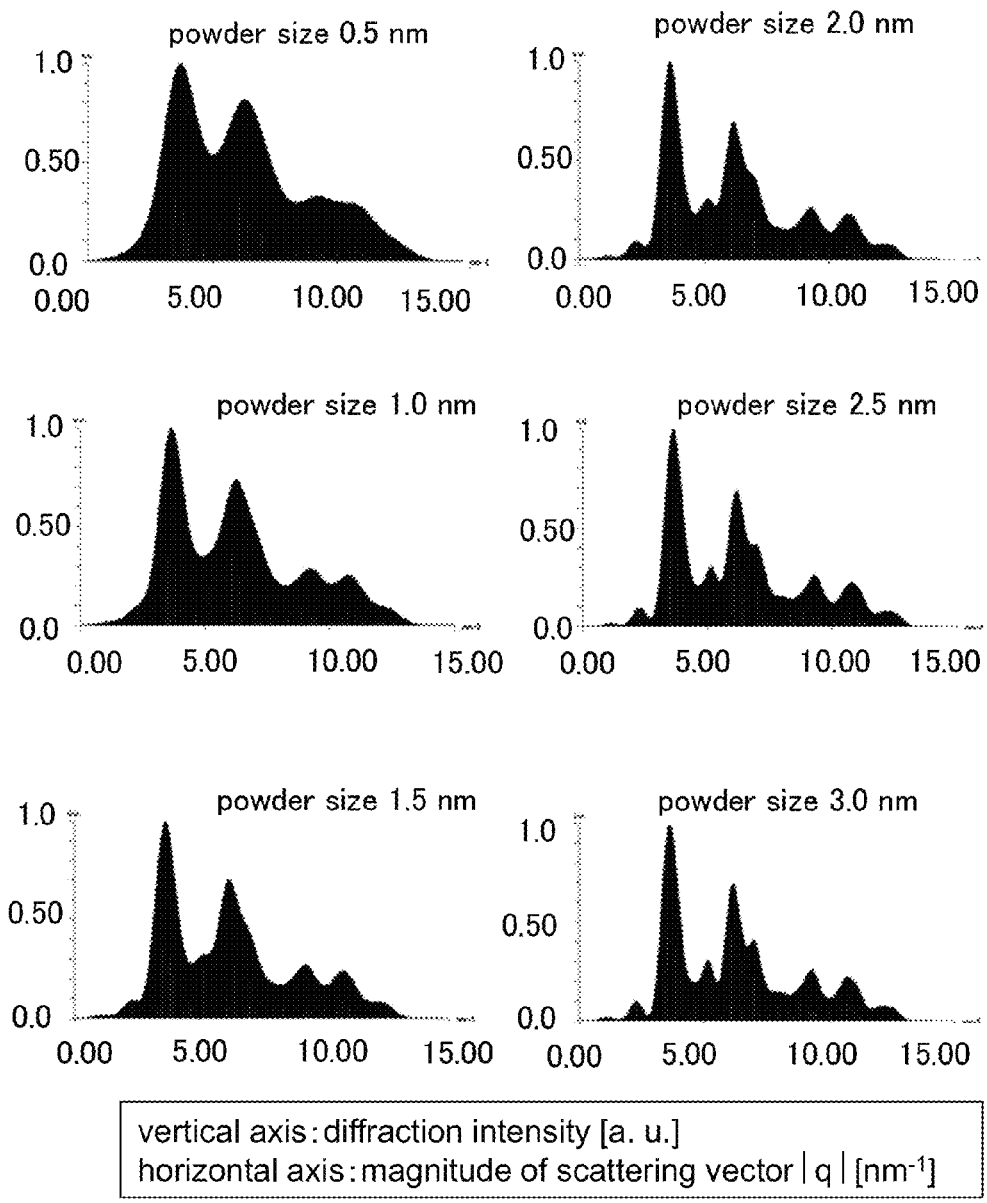
FIG. 7 shows structural analysis results obtained by calculation of crystalline $InGaZnO_4$.

FIG. 7 shows profiles of electron diffraction luminance of crystalline InGaZnO$_4$, which were obtained by the calculation. According to FIG. 7, besides a first peak, a plurality of peaks are observed in crystalline InGaZnO$_4$. In addition, as the powder size is increased, the width of the first peak becomes narrow.

Figure 8:
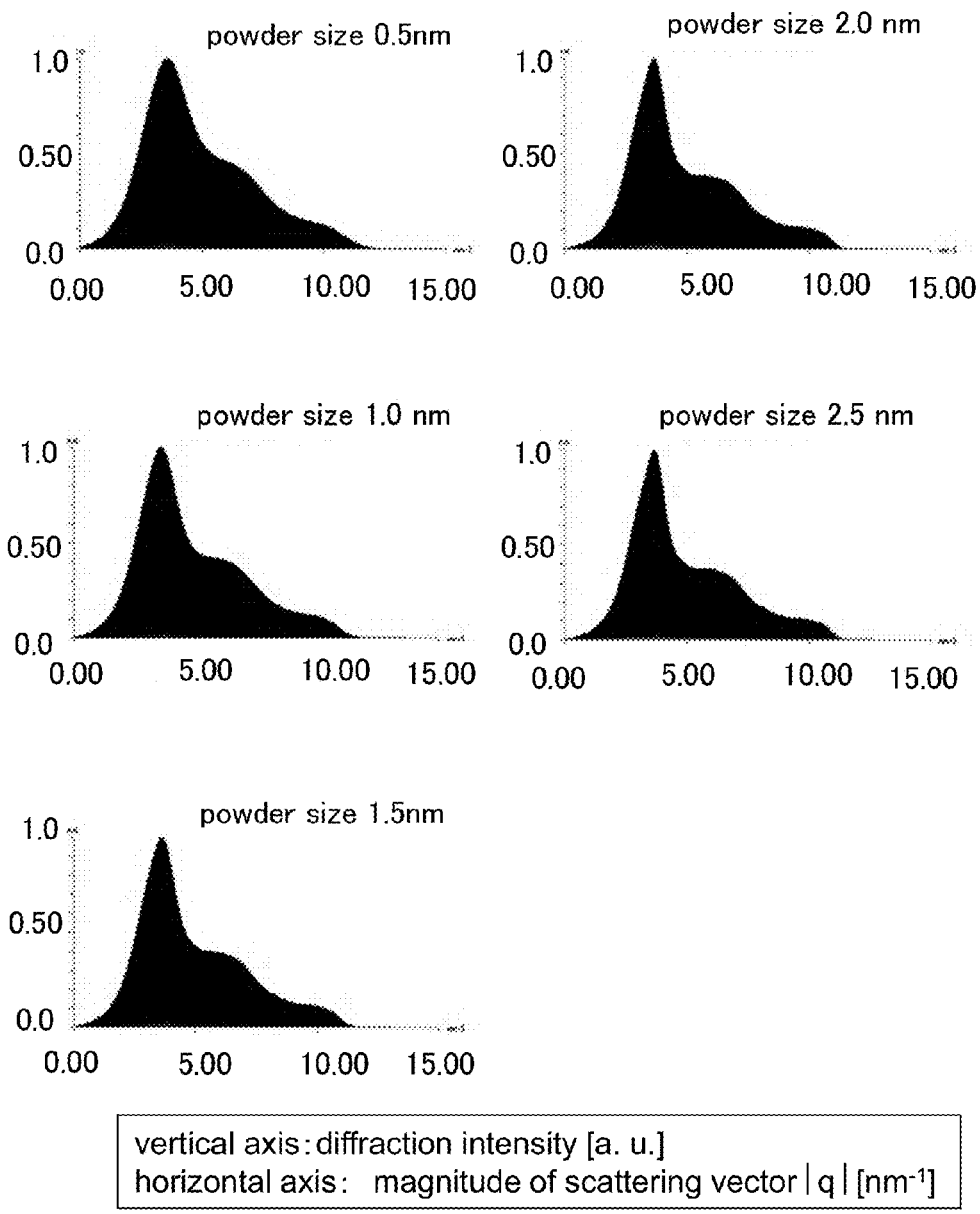
FIG. 8 shows structural analysis results obtained by calculation of amorphous $InGaZnO_4$.

FIG. 8 shows profiles of electron diffraction luminance of amorphous InGaZnO$_4$, which were obtained by the calculation. According to FIG. 8, only a first peak is clearly observed, and it was difficult to distinguish another peak from the other parts of profile. Note that the case where the powder size is larger than 3.0 nm is not shown because the powder is larger than a cell size of the model.

Next, the half widths at half maximum of the first peaks (H1) obtained from the calculation results of the crystalline InGaZnO$_4$ and amorphous InGaZnO$_4$ and the half widths at half maximum of the actual measured first peaks (H1) of samples of nanocrystalline In—Ga—Zn oxides (Sample 1 to Sample 7) were compared. The comparison results are shown in FIG. 9.

Figure 9:
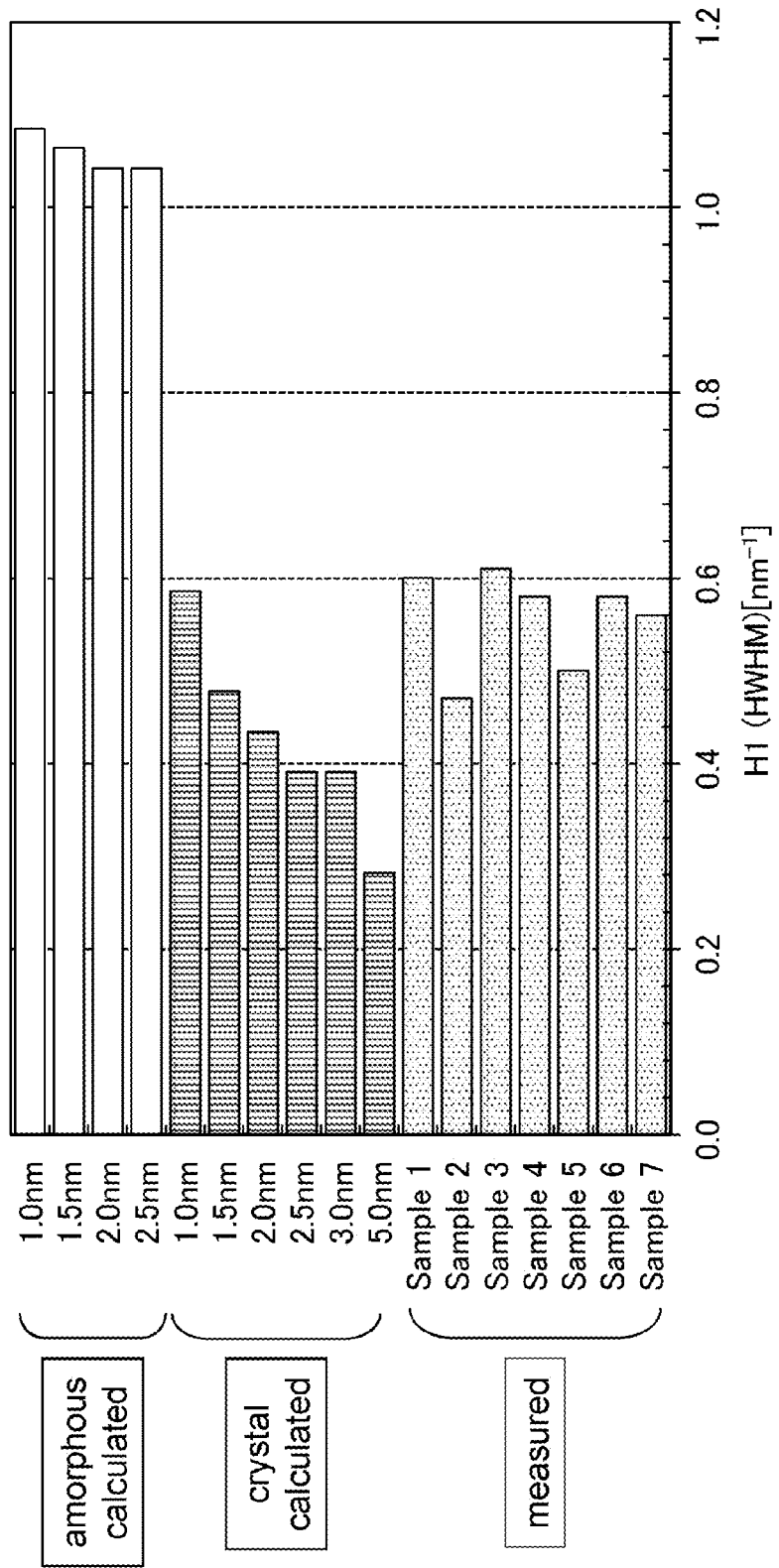
FIG. 9 shows half widths at half maximum of first peaks of electron diffraction luminance profiles.

According to FIG. 9, each calculation value of half widths at half maximum of the first peaks (H1) of amorphous InGaZnO$_4$ is approximately 1.0 [nm$^{-1}$]. In the case of amorphous InGaZnO$_4$, the half widths at half maximum of the first peaks (H1) were equivalent to each other regardless of the powder sizes.

According to FIG. 9, each calculation value of half widths at half maximum of the first peaks (H1) of crystalline InGaZnO$_4$ is about in a range of 0.3 [nm$^{-1}$] to 0.6 [nm$^{-1}$]. In the case of crystalline InGaZnO$_4$, as the powder size is increased, the periodicity of atomic arrangement becomes high. Thus, the larger that powder size is, the narrower the half widths at half maximum of the first peaks (H1) are.

Further, according to FIG. 9, each actual measurement value of half widths at half maximum of the first peaks (H1) of nanocrystalline In—Ga—Zn oxides is about in a range of 0.4 [nm$^{-1}$] to 0.6 [nm$^{-1}$]. Thus, it is found that the half width at half maximum of the first peak (H1) of nanocrystalline In—Ga—Zn oxide is narrower than that of the amorphous InGaZnO$_4$ and is almost equivalent to that of the crystalline InGaZnO$_4$.

Moreover, the half width at half maximum of the first peak (H1) was compared between the nanocrystalline In—Ga—Zn oxide and the crystalline InGaZnO$_4$. The comparison result indicated that the size of nanocrystal was about in a range from 1 nm to 3 nm.

This application is based on Japanese Patent Application serial no. 2013-056952 filed with Japan Patent Office on Mar. 19, 2013, the entire contents of which are hereby incorporated by reference.

What is claimed is:

1. An oxide semiconductor comprising:
an aggregation of a plurality of InGaZnO$_4$ crystals,
wherein each of the plurality of InGaZnO$_4$ crystals has a size larger than or equal to 1 nm and smaller than or equal to 3 nm, and
wherein the plurality of InGaZnO$_4$ crystals have no orientation.

2. The oxide semiconductor according to claim 1,
wherein a diffraction pattern having a plurality of spots is observed when an electron diffraction measurement is performed on the oxide semiconductor by using an electron beam with a probe diameter larger than or equal to 1 nm and smaller than or equal to 30 nm, and
wherein a diffraction pattern with no spot is observed when an electron diffraction measurement is performed on the oxide semiconductor by using an electron beam with a probe diameter larger than or equal to 300 nm.

3. The oxide semiconductor according to claim 2,
wherein the plurality of spots are circularly arranged.

4. An oxide semiconductor comprising:
indium, gallium and zinc,
wherein a diffraction pattern having a plurality of spots circularly arranged is observed when an electron diffraction measurement is performed on the oxide semiconductor by using an electron beam with a probe diameter larger than or equal to 1 nm and smaller than or equal to 30 nm, and
wherein a diffraction pattern with no spot is observed when an electron diffraction measurement is performed on the oxide semiconductor by using an electron beam with a probe diameter larger than or equal to 300 nm.

* * * * *